(12) United States Patent
Vogt et al.

(10) Patent No.: US 9,768,148 B2
(45) Date of Patent: Sep. 19, 2017

(54) STACKED MEMORY WITH INTERFACE PROVIDING OFFSET INTERCONNECTS

(71) Applicant: Intel Corporation, Santa Clara, CA (US)

(72) Inventors: Pete Vogt, Boulder, CO (US); Andre Schaefer, Braunschweig (DE); Warren Morrow, Steilacoom, WA (US); John Halbert, Beaverton, OR (US); Jin Kim, Beaverton, OR (US); Kenneth Shoemaker, Los Altos Hills, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/588,183

(22) Filed: Dec. 31, 2014

(65) Prior Publication Data

US 2015/0108660 A1 Apr. 23, 2015

Related U.S. Application Data

(63) Continuation of application No. 13/997,148, filed as application No. PCT/US2011/063191 on Dec. 2, 2011, now Pat. No. 8,971,087.

(51) Int. Cl.
*G11C 5/06* (2006.01)
*H01L 25/065* (2006.01)
(Continued)

(52) U.S. Cl.
CPC ............ *H01L 25/0657* (2013.01); *G11C 5/06* (2013.01); *H01L 23/481* (2013.01);
(Continued)

(58) Field of Classification Search
CPC ...... H01L 25/0657; H01L 23/481; G11C 5/06
(Continued)

(56) References Cited

U.S. PATENT DOCUMENTS

| 7,701,045 B2 | 4/2010 | Ware et al. |
| 8,174,859 B2 | 5/2012 | Jeddeloh |

(Continued)

FOREIGN PATENT DOCUMENTS

| CN | 101770439 | 7/2010 |
| KR | 10-2011-0056469 | 5/2011 |

(Continued)

OTHER PUBLICATIONS

Gabriel H. Loh, "3D-Stacked Memory Architectures for Multi-Core Processors," International Symposium on Computer Architecture, 2008 IEEE, pp. 453-464.

(Continued)

*Primary Examiner* — Anthan Tran
(74) *Attorney, Agent, or Firm* — Blakely Sokoloff Taylor and Zafman LLP

(57) ABSTRACT

A stacked memory with interface providing offset interconnects. An embodiment of memory device includes a system element and a memory stack coupled with the system element, the memory stack including one or more memory die layers. Each memory die layer includes first face and a second face, the second face of each memory die layer including an interface for coupling data interface pins of the memory die layer with data interface pins of a first face of a coupled element. The interface of each memory die layer includes connections that provide an offset between each of the data interface pins of the memory die layer and a corresponding data interface pin of the data interface pins of the coupled element.

24 Claims, 6 Drawing Sheets

(51) Int. Cl.
*H01L 27/108* (2006.01)
*H01L 23/48* (2006.01)
*H01L 23/00* (2006.01)

(52) U.S. Cl.
CPC ...... *H01L 27/108* (2013.01); *H01L 27/10897* (2013.01); *H01L 24/16* (2013.01); *H01L 27/10882* (2013.01); *H01L 2224/16146* (2013.01); *H01L 2225/06513* (2013.01); *H01L 2225/06517* (2013.01); *H01L 2225/06541* (2013.01)

(58) Field of Classification Search
USPC .......................................................... 365/63
See application file for complete search history.

(56) References Cited

U.S. PATENT DOCUMENTS

| | | | |
|---|---|---|---|
| 8,233,303 | B2 | 7/2012 | Best et al. |
| 2007/0235851 | A1 | 10/2007 | Ware et al. |
| 2009/0166065 | A1 | 7/2009 | Clayton et al. |
| 2009/0294899 | A1 | 12/2009 | Pagaila et al. |
| 2010/0174858 | A1* | 7/2010 | Chen ............... G06F 13/28 711/105 |
| 2011/0040945 | A1 | 2/2011 | Norman |
| 2011/0050320 | A1 | 3/2011 | Gillingham |
| 2011/0079923 | A1 | 4/2011 | Suh |
| 2011/0148469 | A1* | 6/2011 | Ito ..................... G11O 5/04 327/77 |
| 2011/0170266 | A1 | 7/2011 | Haensch et al. |
| 2011/0194326 | A1* | 8/2011 | Nakanishi ........... G11C 5/02 365/51 |
| 2011/0194369 | A1 | 8/2011 | Jeddeloh |
| 2011/0246746 | A1 | 10/2011 | Keeth et al. |
| 2011/0249483 | A1 | 10/2011 | Oh et al. |

FOREIGN PATENT DOCUMENTS

| | | |
|---|---|---|
| WO | WO-2010-138480 | 12/2010 |
| WO | WO-2010/138480 | 12/2010 |

OTHER PUBLICATIONS

International Search Report and Written Opinion of the International Searching Authority, in International Application No. PCT/US2011/063191, dated Aug. 22, 2012, 7 pages.
Notice of Allowance mailed Nov. 7, 2014, in U.S. Appl. No. 13/997,148, 10 pages.
Official Letter dated Jul. 18, 2014 (+ English translation), in Taiwan Patent Application No. 101141560, 9 pages.
Notice of Preliminary Rejection dated Jul. 8, 2015 (+ English translation), in Korean Patent Application No. 10-2014-7016614, 15 pages.
First Office Action dated Dec. 29, 2015 (+ English translation), in Chinese Patent Application No. 201180075236.6, 13 pages.
Official Communication dated Nov. 13, 2015 (+ English translation), in German Patent Application No. 11 2011 105 909.4, 17 pages.
Notice of Preliminary Rejection (+ English Translation) for Korean Application No. 10-2014-7016614 mailed on Mar. 7, 2016, 9 pages.
Notice of Allowance in Korean Application No. 10-2014-7016614 mailed on Jun. 28, 2016, 2 pages.
Notice to Grant (+ English Translation) in Chinese Application No. 201180075236.6 mailed Jul. 29, 2016, 4 pages.
Notice of Allowance (+English Translation) in Taiwan Application No. 103144993 mailed Mar. 17, 2017, 3 pgs.
First Office Action (+English Translation) for Chinese Application No. 20150028887.X mailed Dec. 2, 2016, 25 pages.
Office Action and Search Report in Taiwan Application No. 103144993 mailed Jun. 3, 2016, 15 pages.
International Preliminary Report for PCT Application No. PCT/US2011/063191 mailed Jun. 3, 2014, 6 pages.
Notice of Allowance (+English Translation) in Taiwan Application No. 101141560 mailed Nov. 20, 2014, 3 pages.

* cited by examiner

STACKED MEMORY WITH INTERFACE PROVIDING OFFSET INTERCONNECTS

CROSS-REFERENCE TO RELATED APPLICATIONS

This application is a continuation of U.S. patent application Ser. No. 13/997,148 filed Jun. 21, 2013, which is a U.S. national phase of International Patent Application No. PCT/US2011/063191 filed Dec. 2, 2011. These applications are incorporated herein by reference in their entireties.

TECHNICAL FIELD

Embodiments of the invention generally relate to the field of electronic devices and, more particularly, to a stacked memory with interface providing offset interconnects.

BACKGROUND

To provide memory with additional density for various kinds of computing operations, memory devices having a plurality of closely coupled memory elements (which may be referred to as 3D stacked memory, or stacked memory) are being developed.

A 3D stacked memory may include coupled layers or packages of DRAM (dynamic random-access memory) memory elements, which may be referred to as a memory stack. Stacked memory may be utilized to provide a great amount of computer memory in a single device or package, where the device or package may further include system components, such as a memory controller and CPU (central processing unit) or other system elements.

However, while additional layers of memory elements may be added to a stacked memory device, the operation of such memory is limited by the memory structure. In particular, the addition of memory die layers increases the amount of memory, but does not change the bandwidth of the memory device. For this reason, a stacked memory device may be limited in bandwidth, or may require a design that provides sufficient bandwidth for a maximum number of layers of memory even if many implementations do not require this amount of memory.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
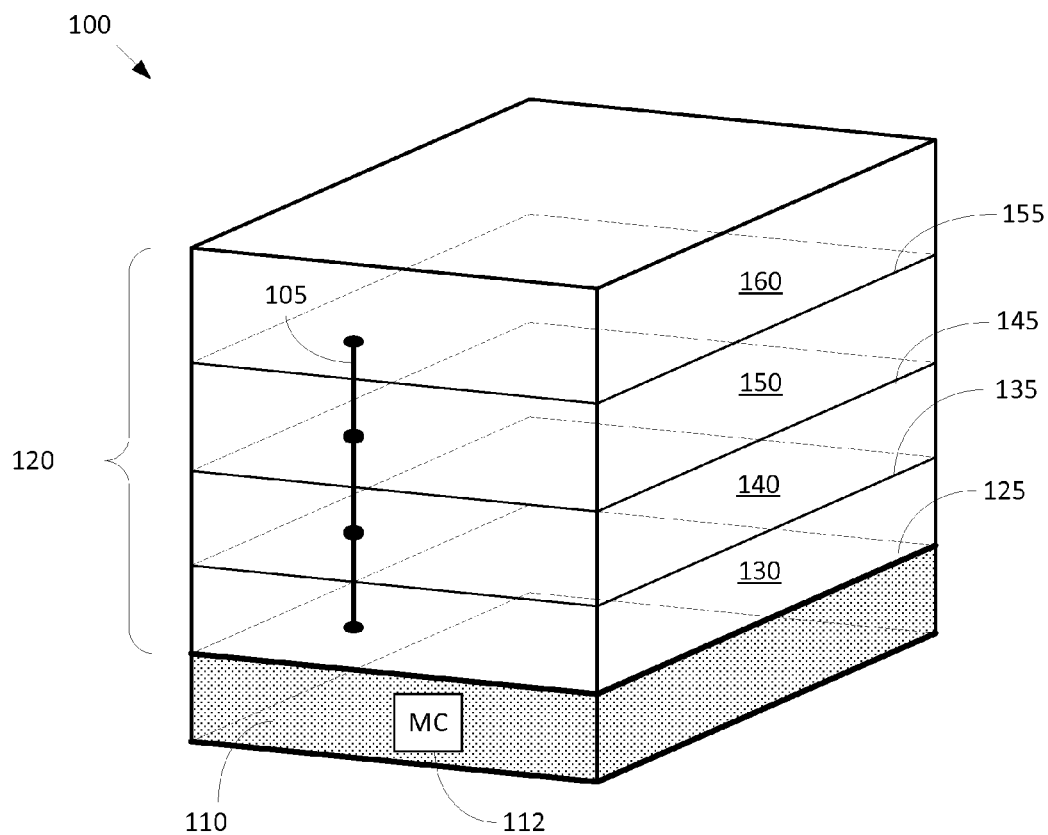
FIG. 1 illustrates an embodiment of a 3D stacked memory.

Embodiments of the invention are generally directed to a stacked memory with interface providing offset interconnects.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC).

In some embodiments, an apparatus, system, and method provide for a stacked memory with interface providing offset interconnects. In some embodiments, an apparatus, system, and method provide for scaling of the bandwidth in a stacked memory. In some embodiments, a stacked memory device having a system layer and one or more memory die layers (each comprising an interface) may provide for offsetting or staggering interface connections between layers to offset the signal paths for each layer in relation to the signal paths of the next layer of the stacked memory. In some embodiments, the stacked memory includes a plurality of channels, where each die layer may drive one or more of the channels of the stacked memory. In one implementation, a stacked memory device having four die layers includes sixteen channels, where each die layer drives four of the sixteen channels.

In some embodiments, the scaling of bandwidth may be utilized to provide a common in-package memory device for apparatuses and systems that differ greatly in memory and processing needs. For example, a memory device that may be used in low-bandwidth, cost-sensitive applications such as cell phones may also be scaled up to provide a bandwidth and amount of memory at a level that is sufficient for high-end computing, such as in a network server application. A common memory device that spans an entire range of products may be utilized to leverage the economies of scale to provide a lower cost memory solution for all such devices.

Conventional memory devices may tie the data interfaces pins for all memory device layers together, which requires additional drivers on each memory device layer, and which requires significant electrical loading on each data interface pin, thus consuming excessive power and limiting the maximum data rate for the memory device.

In some embodiments, an apparatus, system, or method provides for interconnecting memory device layers in a stack in a structure and manner to enable the amount of bandwidth available in the memory stack to grow as more memory devices are added to the stacked memory. In some embodiments, a stacked memory device architecture enables the generation of devices of different size that are the same in structure but that have data interface pins are driven from separate memory device layers. In an implementation, a particular memory device may be stacked to greater stack size to provide additional capacity, with the bandwidth increasing with the addition of stack layers. In some embodiments, the structure of a memory device reduces the electrical loading on each data interface pin to lower power and increases the data rate for the memory device.

In some embodiments, an apparatus, system, or method for scaling bandwidth in a stacked memory device uses traces or other interconnects in each memory die layer in the memory stack to re-route the data interface signals from memory die layers higher in the stack onto alternative data interface pins. In some embodiments, one or more of the memory device layers, and potentially all layers of the memory stack, include staggered interconnects that re-route signal paths from each data interface pin of a first memory die layer to a corresponding data interface pin of a second memory die, where each data interface pin of the second memory die layer is offset from the corresponding data interface pin of the first memory die layer. The structure of the stacked memory device may be utilized to provides a point-to-point connection from the memory device data interface pins to the memory controller. The staggering of interconnects in an embodiment of a stacked memory device provides for expansion of bandwidth with each additional memory die layers of the stacked memory device.

In some circumstances, the number of memory die layers of a stacked memory device may be greater than the number of alternative data interface pins of the device. In some embodiments, a wrap-around routing interconnect enables the height of the stacked memory to be larger than the number of alternative data interface pin sets to provide a point-to-two-point (or more) topology. In some embodiments, a routing connecting for a first memory die layer is wrapped to connect with a second memory die layer that is a certain number of layers away from the first layer.

In an example, a stacked memory device may include X data routes (where X is two or more, but may be four in this example), and the memory device includes greater than X memory die layers (X+1 or more, but may be eight memory die layers in this example. For example, a first memory die layer coupled to the system layer may have a route to a fifth memory die layer via the wrap-around interconnect routing. Further, a second memory die layer may have a route to a sixth memory die layer, and continuing through the other memory die layers of the device.

FIG. 1 illustrates an embodiment of a 3D stacked memory. In this illustration, a 3D stacked memory device 100 includes a system element 110 coupled with one or more DRAM memory die layers 120, also referred to herein as the memory stack. In some embodiments, the system element may be a system on chip (SoC) or other similar element. While FIG. 1 illustrates an implementation in which the system element 110 is coupled below the memory stack of one or more memory die layers 120, embodiments are not limited to this arrangement. For example, in some embodiments a system element 110 may be located adjacent to the memory stack 120, and thus may be coupled in a side-by-side arrangement with the memory stack 120.

In this illustration, the DRAM memory die layers include four memory die layers, these layers being a first memory die layer 130, a second memory die layer 140, a third memory die layer 150, and a fourth memory die layer 160. However, embodiments are not limited to any particular number of memory die layers in the memory stack 110, and may include a greater or smaller number of memory die layers. Among other elements, the system element 110 may include a memory controller 112 for the memory stack 120. In some embodiments, each memory die layer (with the possible exception of the top, or outermost, memory die layer, such as the fourth memory die layer 160 in this illustration) includes a plurality of through silicon vias (TSVs) to provide paths through the silicon substrate of the memory die layers.

In some embodiments, each memory die layer includes an interface for a connection with another die layer or the system element 110. In this illustration, the first memory die layer 130 includes a first interface 125 for the coupling between the first memory die layer 130 and the system element 110; the second memory die layer 140 includes a second interface 135 for the coupling between the second memory die layer 140 and the first memory die layer 130; the third memory die layer 150 includes a third interface 145 for the coupling between the third memory die layer 150 and the second memory die layer 140; and the fourth memory die layer 160 includes a fourth interface 155 for the coupling between the fourth memory die layer 160 and the third memory die layer 150. In some embodiments, each interface provides for staggering of interface pins so that each interface pin of a memory die layer is offset from a connected interface pin of a coupled memory die layer or system element.

In some embodiments, the stacked memory device 100 provides for expansion of bandwidth as additional memory die layers are added to the memory stack 120. In some embodiments, the staggering of interface pins provided in each interface are arranged to provide for routing of connections from the system layer though intervening memory die layers to connections for each interface.

Figure 2:
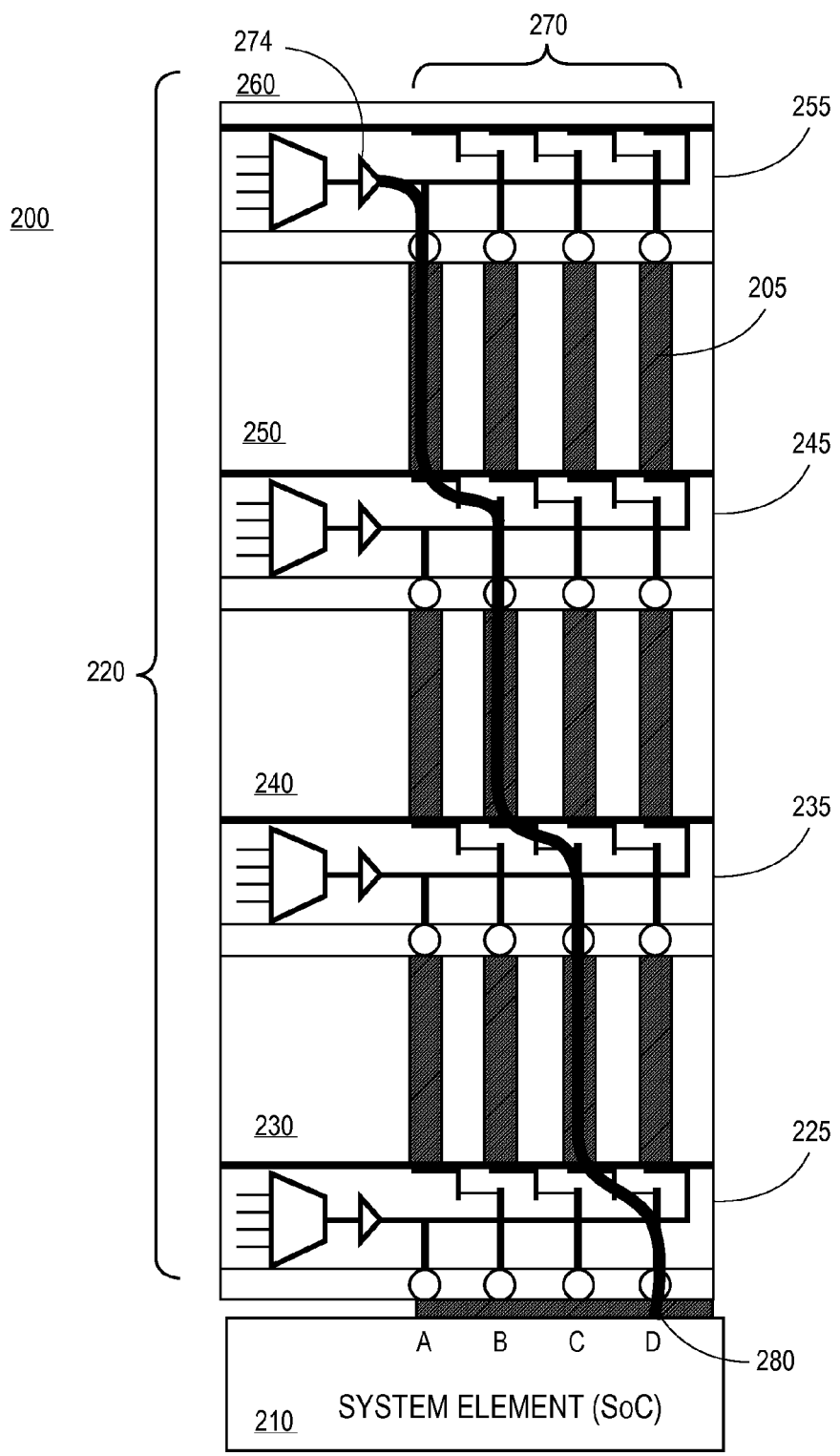
FIG. 2 illustrates routing of a data path for an embodiment of a stacked memory device.

FIG. 2 illustrates routing of a data path for an embodiment of a stacked memory device. In some embodiments, a stacked memory device 200 may include a plurality of memory die layers 220, which in this illustration includes four memory die layers (230, 240, 250, and 260), coupled with a system element 210, which may be an SoC. However, embodiments are not limited to any particular number of memory die layers. As illustrated, a signal path, such as path 280, provides a path from a memory die layer to a channel connection of the system element 210. As illustrated, the first memory die layer 230, the second memory die layer 240, and the third memory die layer 250 each include TSVs to provide connection through each of such memory die layers.

In some embodiments, each memory die layer includes an interface providing a connection with a coupled memory die layer or the system element. In this illustration, the first memory die layer 230 includes a first interface 225 for the coupling between the first memory die layer 230 and the system element 210; the second memory die layer 240 includes a second interface 235 for the coupling between the second memory die layer 240 and the first memory die layer 230; the third memory die layer 250 includes a third interface 245 for the coupling between the third memory die layer 250 and the second memory die layer 240; and the fourth memory die layer 260 includes a fourth interface 255 for the coupling between the fourth memory die layer 260 and the third memory die layer 250. In some embodiments, the interfaces provide for staggering of connections to reroute a data path such that each interface connection of a memory die layer is offset from a corresponding connected interface pin of an adjoining memory die layer or the system element.

As illustrated in FIG. 2, a signal route 280 provides a path from the fourth memory die layer 260 where the connection is offset by interface 255, through a TSV of the third memory die layer 250 where the connection is offset by interface 245, through a TSV of the second memory die layer 240 where the connection is offset by interface 235, and through a TSV of the first memory die layer 230 where the connection is offset by interface 225, to the D channel interface connection of the system element 210. In some embodiments, the interface of each memory die layer includes a driver 274 for the channel of the memory.

Figure 3:
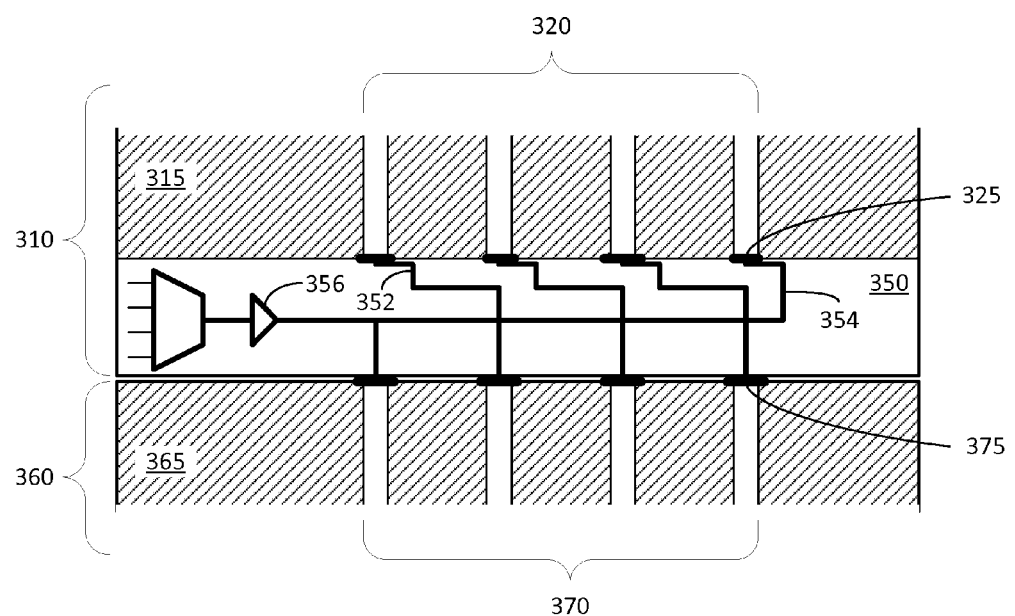
FIG. 3 is an illustration of an interface of an embodiment of a memory die in a stacked memory device.

FIG. 3 is an illustration of an interface of an embodiment of a memory die in a stacked memory device. In this illustration, a first memory die element 310 comprising a silicon substrate 315, the first memory die element having a first face (or surface) and a second face. In this discussion, the first face is generally illustrated as an upper portion of the memory die element and the second face is generally illustrated as a lower portion of the memory die element, but embodiments are not limited to this particular alignment of the elements of a device. The first memory die element 310 includes an interface 350 on the second face of the memory die element, the first memory die element 310 including a first plurality of interface pins 325 (where "pin" refers to any kind of electrical connection point). The first memory die element 310 may further include TSVs 320 through the silicon substrate 315.

The interface 350 of the first memory die element 310 may be utilized to couple the second face of the first memory die element 310 with a first face of a second element 360, where the second element may include a second memory die element or a system element of the stacked memory device. In this illustration, the second element 360 may include a substrate 365 of silicon or other material, with the first face of the second element including a second plurality of interface pins 375. The second element 360 may further include a plurality of TSVs 370 to provide signal paths through the second element 360.

In some embodiments, the interface 350 of the first memory die element 310 includes interconnects 352 that offset each of the first plurality of interface pins 325 of the first memory die element in relation to the second plurality of interface pins 375 of the second element 360, the interconnects including a wrap around interconnect 354 to connect a last pin of the first plurality of interface pins with a first pin of the second plurality of interface pins. For example, if the first memory die element 310 includes four interface pins 325 (which in FIG. 3 from left to right may be referred to as a first pin, a second pin, a third pin, and a fourth pin) and the second element 360 includes four interface pins 375, the interface pins 325 of the first memory die 310 being aligned with the interface pins 375 of the second element 360, then the interconnects 352 provide that each of the first plurality of interface pins 325 is connected with an offset pin of the second plurality of interface pins 375. Thus, the first interface pin of the first plurality of interface pins 325 is connected with the second interface pin of the second plurality of interface pins 375; the second interface pin of the first plurality of interface pins is connected with the third interface pin of the second plurality of interface pins; the third interface pin of the first plurality of interface pins is connected with the fourth interface pin of the second plurality of interface pins; and the fourth interface pin of the first plurality of interface pins is connected with the first interface pin of the second plurality of interface pins.

The interface 350 of the first memory die element 310 further includes a driver 356 to drive one or more channels of the stacked memory device. In some embodiments, the interface 350 allows for scaling of bandwidth of the stacked memory device with the addition of the first memory die element 310 to the stacked memory device.

Figure 4:
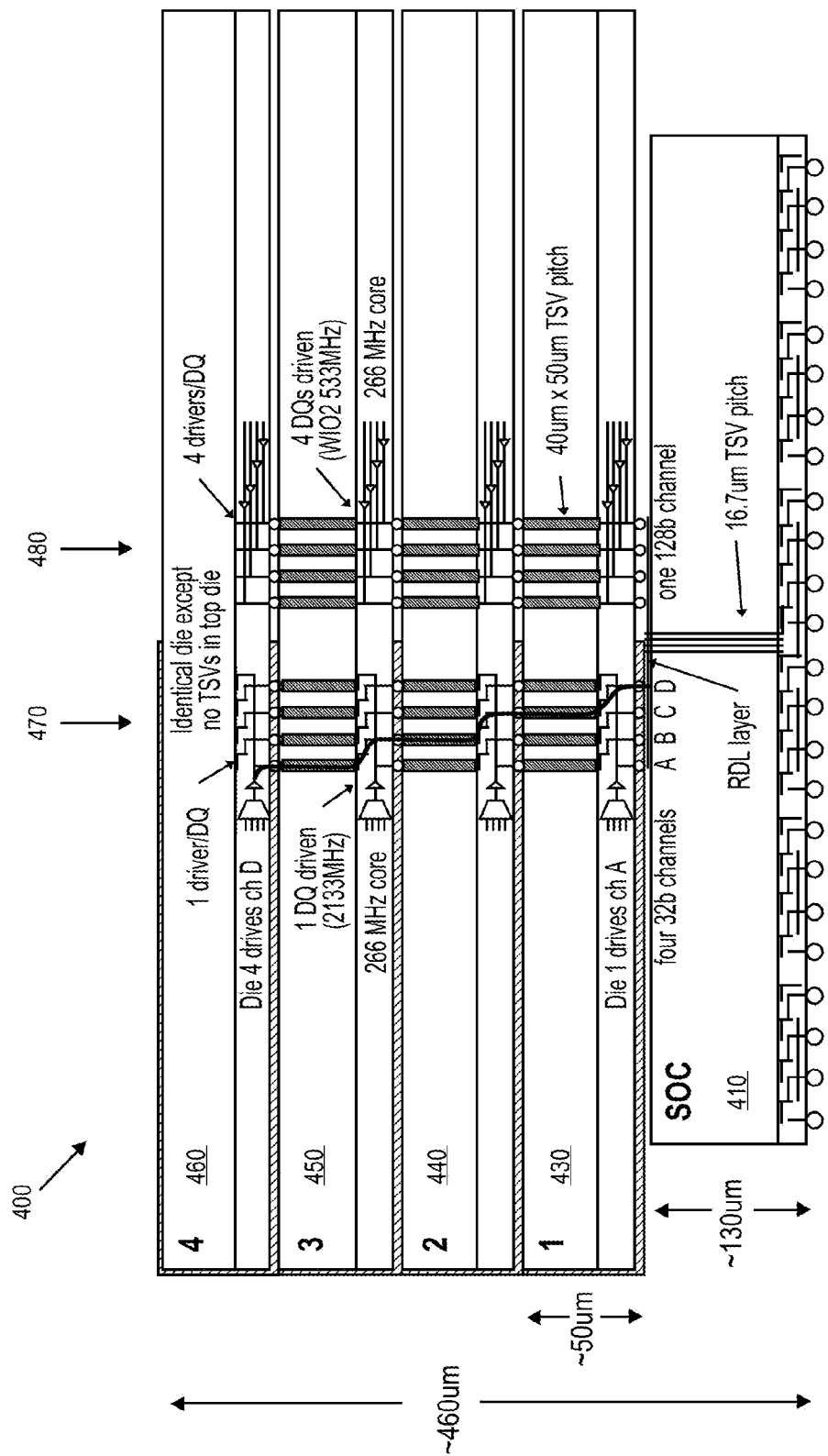
FIG. 4 illustrates an embodiment of a stacked memory device including routing to expand bandwidth with the addition of memory die layers.

FIG. 4 illustrates an embodiment of a stacked memory device including routing to expand bandwidth with the addition of memory die layers. In some embodiments, a stacked memory device 400 includes an SoC 410 coupled with a memory stack comprising a plurality of memory die layers, where the memory die layers are illustrated as memory die layers 430, 440, 450, and 460.

In some embodiments, the stacked memory device 400 provides for routing 470 in the manner shown in FIG. 2, wherein each memory die layer provides for staggering of each interface pin connection. In this illustration, the first memory die 430 drives channel A, the second memory die 440 drives channel B, the third memory die 450 drives channel C, and the fourth memory die 460 drives channel D.

The routing 470 is contrasted with conventional routing 480, wherein the interface connection pins of each memory die layer are connected with interface connection pins of an adjoining memory die layer without staggering or re-routing of the connections. As a result, the interface of each layer of the device using conventional routing requires a driver for each channel of the stacked memory device.

Figure 5:
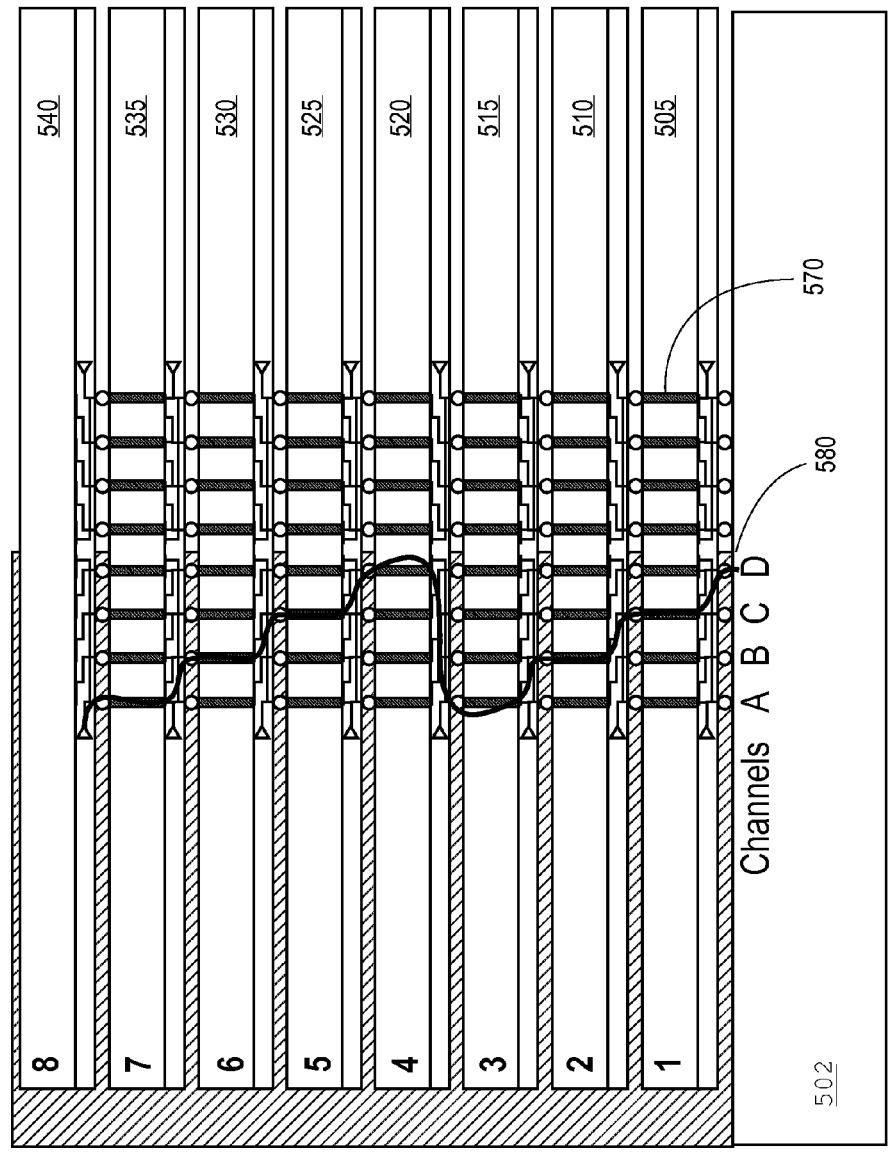
FIG. 5 illustrates routing of a data path for an embodiment of a memory device having additional memory die layers.

FIG. 5 illustrates routing of a data path for an embodiment of a stacked memory device having additional memory die layers. In some embodiments, a stacked memory device is structured to handle a greater number of memory die layers than interconnect pins for the receiving device. In this particular example the stacked memory device 500 includes eight memory die layers (designated in FIG. 5 as memory die layers 505, 510, 515, 520, 525, 530, 535, and 540), where the stacked memory device provides four channels.

In some embodiments, the stacked memory device 500 utilizes wrap around connections of each interface for the interconnection of the additional memory elements above the number of channels of the stacked memory device. While embodiments may include any number greater than the number of channels, in this example the stacked memory device includes eight memory die layers. In some embodiments, the interface of each memory die layer includes a wrap around connection such that a memory die layer may be connected to another memory die layer. In this example, the wrap around connections of the interface of each memory die layer provides for an interconnection of memory die layer 405 and memory die layer 525, memory die layer 510 and memory die layer 530, and continuing through memory die layer 520 and memory die layer 540.

In some embodiments, the stacked memory architecture illustrated in FIG. 5 allows for additional memory expansion by utilizing point-to-two-point (or more) topology that connects the memory die layers according to the staggering of interface pins by the interfaces of each of the memory die layers.

Figure 6:
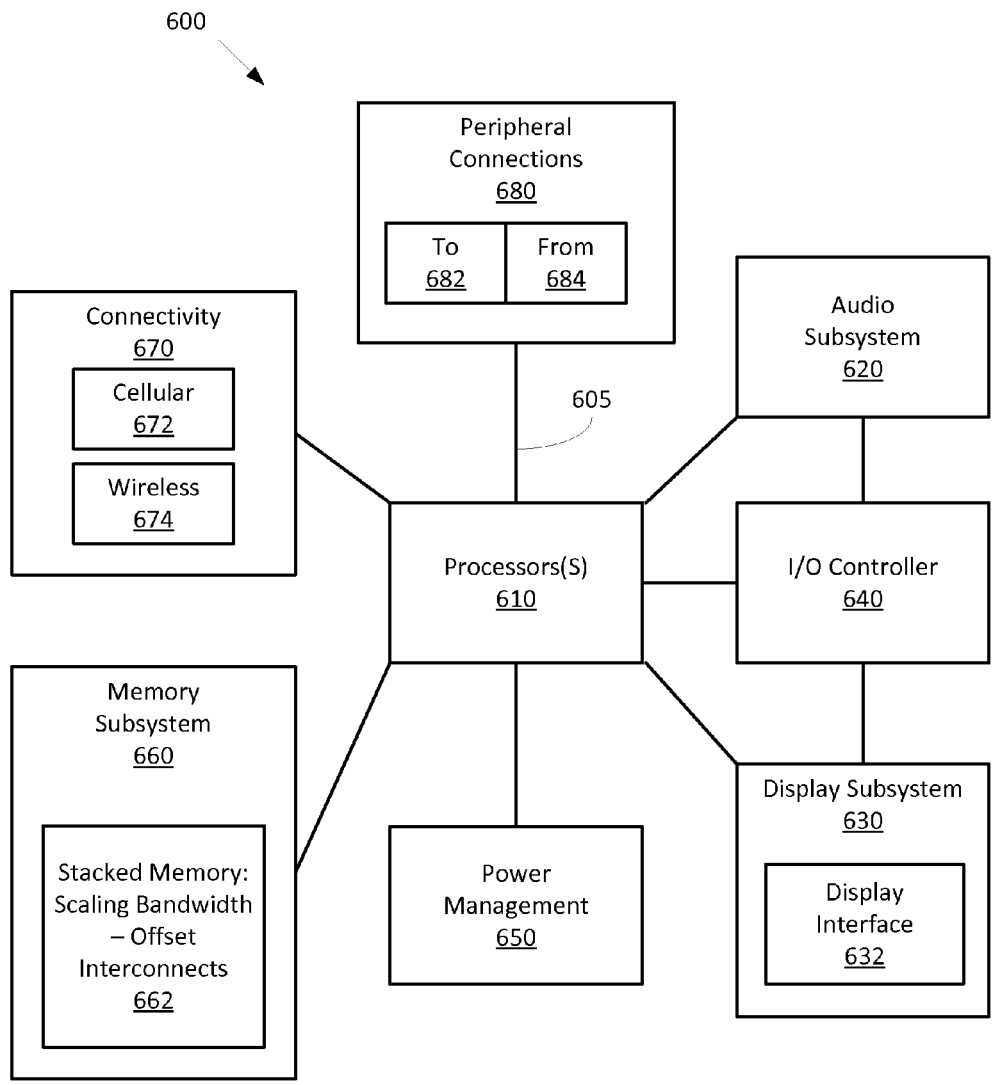
FIG. 6 is a block diagram to illustrate an embodiment of an apparatus or system including a stacked memory device.

A stacked memory may be utilized in many different computing environments, depending on the number of memory die layers in a memory device. FIG. 6 is a block diagram to illustrate an embodiment of an apparatus or system including a stacked memory device. Computing device 600 represents a computing device including a mobile computing device, such as a laptop, a computing tablet, a mobile phone or smartphone, a wireless-enabled e-reader, or other wireless mobile device. It will be understood that certain of the components are shown generally, and not all components of such a device are shown in device 600. The components may be connected by one or more buses or other connections 605.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, display subsystem 630, or both such subsystems. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as system data (whether long-term or temporary) related to the execution of the applications and functions of system 600.

In some embodiments, the memory subsystem 660 may include a stacked memory device 662, such as illustrated in FIGS. 1 through 5, where the stacked memory device includes one or more memory die layers and a system element. In some embodiments, the stacked memory device 662 provides for scaling up bandwidth with the addition of memory die layers through the utilization of offset interconnects in memory die interfaces, such as illustrated in FIG. 3. In some embodiments, the memory needs of the device 600 may be matched with a stacked memory device 662 having a correct number of memory die layers.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as WiFi), wide area networks (such as WiMax), and other wireless communications.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:
    a memory die, the memory die being a first element of a stack of elements of the memory device, wherein the memory die comprises a plurality of through silicon vias (TSVs) including a first through silicon via (TSV), wherein the memory die has a side, wherein the side of the memory die comprises a first electrical connection region and the first electrical connection region is coupled to the first TSV, and
    an interface region on the side of the memory die wherein the interface region comprises a first interconnect for a first signal path of a plurality of signal paths, each of the plurality of signal paths connecting each element of the stack of elements of the memory device, the first signal path including the first TSV and including a portion between the memory die and a second element of the memory device via the first interconnect, wherein the first interconnect is electrically coupled to the first electrical connection region, and wherein the first interconnect terminates in a second electrical connection region, and
    wherein the first TSV passes through the memory die in a first direction, wherein the first interconnect provides a first offset of the first signal path between the first electrical connection region and the second electrical connection region, the first offset of the first signal path being a portion of the first signal path that is in a second direction, and wherein the first direction is different from the second direction and the second electrical connection region is aligned in the first direction with a TSV other than the first TSV.

2. The memory device of claim 1, wherein the stack of elements include a system element, and wherein the system element is coupled to the memory die through the interface region and wherein the portion of the first signal path via the first interconnect provides a path between the memory die and the system element.

3. The memory device of claim 2, wherein the system element is a system on a chip (SoC).

4. The memory device of claim 1, wherein the plurality of TSVs of the memory die further includes a second TSV, wherein the side of the memory die also comprises a third electrical connection region, wherein the third electrical connection region is coupled to the second TSV, wherein the interface region further includes a second interconnect for a second signal path of the plurality of signal paths connecting each element of the stack of elements of the memory device, the second signal path including a portion between the memory die and the second element of the memory device via the second interconnect, wherein the second interconnect is electrically coupled to the third electrical connection region, wherein the second interconnect terminates in a fourth electrical connection region, wherein the second interconnect provides a second offset of the second signal path between the third electrical connection region and the fourth electrical connection region, the second offset being a portion of the second signal path that is in a third direction, and wherein the third direction is different from the first direction.

5. The memory device of claim 4, wherein the first offset and the second offset are each an offset of the respective signal path to align the respective signal path with an adjacent TSV of the plurality of TSVs.

6. The memory device of claim 4, wherein one of the first offset and the second offset is an offset of the respective first or second signal path to align the signal path with an adjacent TSV of the plurality of TSVs and the other of the first offset and second offset is a wrap-around offset of the other of the first or second signal path from a last of the plurality of TSVs to align with a first of the plurality of TSVs.

7. The memory device of claim 4, wherein the third direction is also different from the second direction.

8. The memory device of claim 1, wherein each signal path of the plurality of signal paths follows a path through each element of the stack of elements of the memory device that does not align with itself along the first direction in adjacent elements of the stack of elements.

9. A memory device comprising:
a first memory die, the first memory die being a first element of a stack of elements of the memory device, wherein the first memory die comprises a plurality of through silicon vias (TSVs), wherein the first memory die has a side, wherein the side of the first memory die has an interface region thereon, wherein the interface region comprises a plurality of interconnects including a first interconnect for a first signal path of a plurality of signal paths and a second interconnect for a second signal path of the plurality of signal paths, each of the plurality of signal paths connecting each element of the stack of elements of the memory device, and wherein the first interconnect is electrically coupled to a first through silicon via (TSV) of the plurality of TSVs and the second interconnect is electrically coupled to a second TSV of the plurality of TSVs, wherein the first signal path includes the first TSV and the second signal path includes the second TSV, and
a second memory die, the second memory die being a second element of the stack of elements of the memory device, wherein the second memory die has a side, wherein the side of the second memory die comprises a plurality of electrical connection regions, and
wherein the first memory die is stacked on the second memory die, wherein the first interconnect of the plurality of interconnects is coupled to a first electrical connection region of the plurality of electrical connection regions of the second memory die, wherein the first TSV passes through the first memory die along a first line in a first direction, wherein the first interconnect provides an offset of the first signal path between the first electrical connection region of the second memory die and the first TSV, the first offset of the first signal path being a portion of the first signal path that is in a second direction, and wherein the first direction is different from the second direction and the first electrical connection region is aligned along a second line in the first direction with a TSV of the plurality of TSVs other than the first TSV, and wherein the second interconnect of the plurality of interconnects is coupled to a second electrical connection region of the plurality of electrical connection regions of the second memory die.

10. The memory device of claim 9, wherein the second memory die also comprises a plurality of TSVs and wherein the plurality of electrical connection regions of the second memory die are each electrically coupled to a different TSV of the plurality of TSVs of the second memory die.

11. The memory device of claim 9, further comprising a third memory die, wherein the third memory die is stacked on the first memory die.

12. The memory device of claim 10, further comprising a system element, wherein the system element is coupled to the second memory die and is able to communicate with the first memory die through a TSV of the second memory die.

13. The memory device of claim 12, wherein the system element is a system on a chip (SoC).

14. The memory device of claim 9 wherein the second TSV of the plurality of TSVs lies along a third line in the first direction, wherein the second interconnect lies along a fourth line in the first direction, and wherein the third line is different from the fourth line.

15. The memory device of claim 11, wherein a bandwidth of the memory device with three dies is larger than a bandwidth of a memory device with two dies.

16. The memory device of claim 9, wherein each signal path of the plurality of signal paths follows a path through each element of the stack of elements of the memory device that does not align with itself along the first direction in adjacent elements of the stack of elements.

17. A system comprising:
a processor,
a wireless connectivity component wherein the wireless connectivity component allows the system to communicate wirelessly with an external device and wherein the processor and the wireless connectivity component are coupled, and
a memory device, wherein the processor and the memory device are coupled together, and wherein the memory device comprises a stack of elements including:
a first memory die wherein the first memory die comprises a plurality of through silicon vias (TSVs), wherein the first memory die has a side, wherein the side of the first memory die has an interface region thereon, wherein the interface region comprises a plurality of interconnects, and wherein a first interconnect of the plurality of interconnects is electrically coupled to a first through silicon via (TSV) of the plurality of TSVs and a second interconnect of the plurality of interconnects is electrically coupled to a second TSV of the plurality of TSVs, wherein the first signal path includes the first TSV and the second signal path includes the second TSV, and
a second memory die, wherein the second memory die has a side, wherein the side of the second memory die comprises a plurality of electrical connection regions, and
wherein the first memory die is stacked on the second memory die, wherein the first interconnect of the plurality of interconnects is for a first signal path of a plurality of signal paths, each of the plurality of signal paths connecting each element of the stack of elements of the memory device, the first signal path including a portion between the first memory die and the second memory die and is coupled to a first electrical connection region of the plurality of electrical connection regions of the second memory die, wherein a first TSV of the plurality of TSVs passes through the first memory die along a first line in a first direction, wherein the first interconnect provides an offset of the first signal path between the first electrical connection region of the second memory die and the first TSV, the first offset being a portion of the first signal path that is in a second direction, and wherein the first direction is different from the second direction and the first electrical connection region is aligned along a second line in the first direction with a TSV other than the first TSV, and wherein the second interconnect of the plurality of interconnects is coupled to a second electrical connection region of the plurality of electrical connection regions of the second memory die.

18. The system of claim 17, wherein the second memory die also comprises a plurality of TSVs and wherein the plurality of electrical connection regions of the second memory die are each electrically coupled to a different TSV of the plurality of TSVs of the second memory die.

19. The system of claim 18, also including a third memory die wherein the third memory die is stacked on the first memory die.

20. The system of claim 18, also including a system element, wherein the system element is coupled to the second memory die and is able to communicate with the first memory die through a TSV of the second memory die.

21. The system of claim 20, wherein the system element is a system on a chip (SoC).

22. The system of claim 18, wherein the second TSV of the plurality of TSVs lies along a third line in the first direction, wherein the second interconnect lies along a fourth line in the first direction, and wherein the third line is different from the fourth line.

23. The system of claim 19, wherein a bandwidth of the memory device with three dies is larger than a bandwidth of a memory device with two dies.

24. The system of claim 17, wherein each signal path of the plurality of signal paths follows a path through each element of the stack of elements of the memory device that does not align with itself along the first direction in adjacent elements of the stack of elements.

* * * * *